United States Patent
Spinazzola et al.

(10) Patent No.: US 6,574,970 B2
(45) Date of Patent: Jun. 10, 2003

(54) COMPUTER ROOM AIR FLOW METHOD AND APPARATUS

(75) Inventors: R. Stephen Spinazzola, Baltimore, MD (US); Dennis L. Peltz, Perry Hill, MD (US)

(73) Assignee: TOC Technology, LLC, Baltimore, MD (US)

(*) Notice: Subject to any disclaimer, the term of this patent is extended or adjusted under 35 U.S.C. 154(b) by 0 days.

(21) Appl. No.: 09/933,804

(22) Filed: Aug. 22, 2001

(65) Prior Publication Data

US 2002/0059804 A1 May 23, 2002

Related U.S. Application Data

(63) Continuation-in-part of application No. 09/842,167, filed on Apr. 26, 2001, and a continuation-in-part of application No. 09/784,238, filed on Feb. 16, 2001.
(60) Provisional application No. 60/226,887, filed on Aug. 23, 2000, provisional application No. 60/202,934, filed on May 9, 2000, and provisional application No. 60/183,328, filed on Feb. 18, 2000.

(51) Int. Cl.$^7$ ............................................... F25D 17/08
(52) U.S. Cl. ........................ 62/89; 62/259.2; 165/80.3; 361/696
(58) Field of Search ................. 62/259.2, 89; 165/80.3; 361/690, 691, 695, 696

(56) References Cited

U.S. PATENT DOCUMENTS

| | | |
|---|---|---|
| 3,417,575 A | 12/1968 | Stark |
| 3,903,404 A | 9/1975 | Beall et al. |
| 4,089,040 A | 5/1978 | Paulsen ...................... 361/383 |

(List continued on next page.)

FOREIGN PATENT DOCUMENTS

| | | |
|---|---|---|
| DE | 4111333 | 10/1992 |
| DE | 43 30 922 A1 | 3/1995 |
| DE | 43 30 925 A1 | 3/1995 |
| DE | 44 13 128 A1 | 10/1995 |
| DE | 44 13 130 A1 | 10/1995 |
| DE | 196 41 552 C1 | 12/1997 |
| DE | 197 14 838 A1 | 10/1998 |
| DE | 197 14 856 A1 | 10/1998 |
| DE | 198 17 917 A1 | 10/1999 |
| DE | 198 37 705 A1 | 3/2000 |
| DE | 198 42 561 A1 | 4/2000 |
| EP | 0 190 835 | 8/1986 |
| JP | 62-186147 | 8/1987 |
| JP | 362202949 A | 9/1987 |
| JP | 363222916 A | 9/1988 |
| JP | 1273395 | 11/1989 |
| JP | 402098197 A | 4/1990 |
| JP | 402192534 A | 7/1990 |
| JP | 3085796 | 4/1991 |
| JP | 3085797 | 4/1991 |

(List continued on next page.)

*Primary Examiner*—William E. Tapolcai
(74) *Attorney, Agent, or Firm*—Oblon, Spivak, McClelland, Maier & Neustadt, P.C.

(57) ABSTRACT

A computer room reduced air flow method and apparatus is provided which utilizes an increased delta T to reduce the required air quantity required from an air conditioning system, thus resulting in a reduced air flow capability. Specifically, the present invention utilizes an approximately 40° delta T to reduce the CFM requirements by substantially 50% so as to correspondingly reduce the required power for the fan by approximately 50% so as to result in substantial energy savings. The present invention serves to communicate cooling air from a cooling apparatus into an air passageway, guiding the cooling air within the air passageway into the equipment assembly and introducing the air released from the equipment into either a plenum for communicating such released air to the cooling apparatus or introducing the air released from the equipment into the room in which the equipment and/or cooling apparatus are located.

128 Claims, 6 Drawing Sheets

U.S. PATENT DOCUMENTS

| | | |
|---|---|---|
| 4,158,875 A | 6/1979 | Tajima et al. |
| 4,196,526 A | 4/1980 | Berti |
| 4,261,519 A | 4/1981 | Ester |
| 4,352,274 A | 10/1982 | Anderson et al. |
| 4,549,472 A | 10/1985 | Endo et al. |
| 4,653,321 A | 3/1987 | Cunningham et al. |
| 4,710,096 A | 12/1987 | Erlam |
| 4,774,631 A | 9/1988 | Okuyama et al. |
| 4,832,717 A | 5/1989 | Peters |
| 4,851,965 A | 7/1989 | Gabuzda et al. |
| 4,874,127 A | 10/1989 | Collier |
| 5,232,401 A | 8/1993 | Fujita et al. |
| 5,253,484 A | 10/1993 | Corman et al. |
| 5,345,779 A | 9/1994 | Feeney |
| 5,467,607 A | 11/1995 | Harvey |
| 5,544,012 A | 8/1996 | Koike |
| 5,646,050 A | 7/1997 | Li et al. |
| 5,657,641 A | 8/1997 | Cunningham et al. |
| 5,671,805 A | 9/1997 | Stahl et al. |
| 5,681,219 A | 10/1997 | LeFevre et al. |
| 5,700,190 A | 12/1997 | Johnson et al. |
| 5,706,668 A | 1/1998 | Hilpert |
| 5,718,628 A | 2/1998 | Nakazato et al. |
| 5,765,743 A | 6/1998 | Sakiura et al. |
| 5,813,243 A | 9/1998 | Johnson et al. |
| 5,826,432 A | 10/1998 | Ledbetter |
| 5,910,045 A | 6/1999 | Aoki et al. |
| 5,934,368 A | 8/1999 | Tanaka et al. |
| 5,942,049 A | 8/1999 | Li et al. |
| 5,949,646 A | 9/1999 | Lee et al. |
| 5,995,368 A | 11/1999 | Lee et al. |
| 6,011,688 A | 1/2000 | Thornburg et al. |
| 6,052,282 A | 4/2000 | Sugiyama et al. |
| 6,088,225 A | 7/2000 | Parry et al. |
| 6,132,309 A | 10/2000 | Panelli et al. |
| 6,151,903 A | 11/2000 | Hironaka |
| 6,185,098 B1 | 2/2001 | Benavides |
| 6,186,890 B1 | 2/2001 | French et al. |
| 6,193,601 B1 | 2/2001 | Torczynski |
| 6,198,628 B1 | 3/2001 | Smith |
| 6,222,729 B1 | 4/2001 | Yoshikawa |
| 6,243,261 B1 | 6/2001 | Janik et al. |
| 6,264,550 B1 | 7/2001 | Matsumoto |

FOREIGN PATENT DOCUMENTS

| | | |
|---|---|---|
| JP | 3177096 | 8/1991 |
| JP | 4-203833 | 7/1992 |
| JP | 4368199 | 12/1992 |
| JP | 405106888 A | 4/1993 |
| WO | WO 96/34519 | 10/1996 |
| WO | WO 98/45934 | 10/1998 |

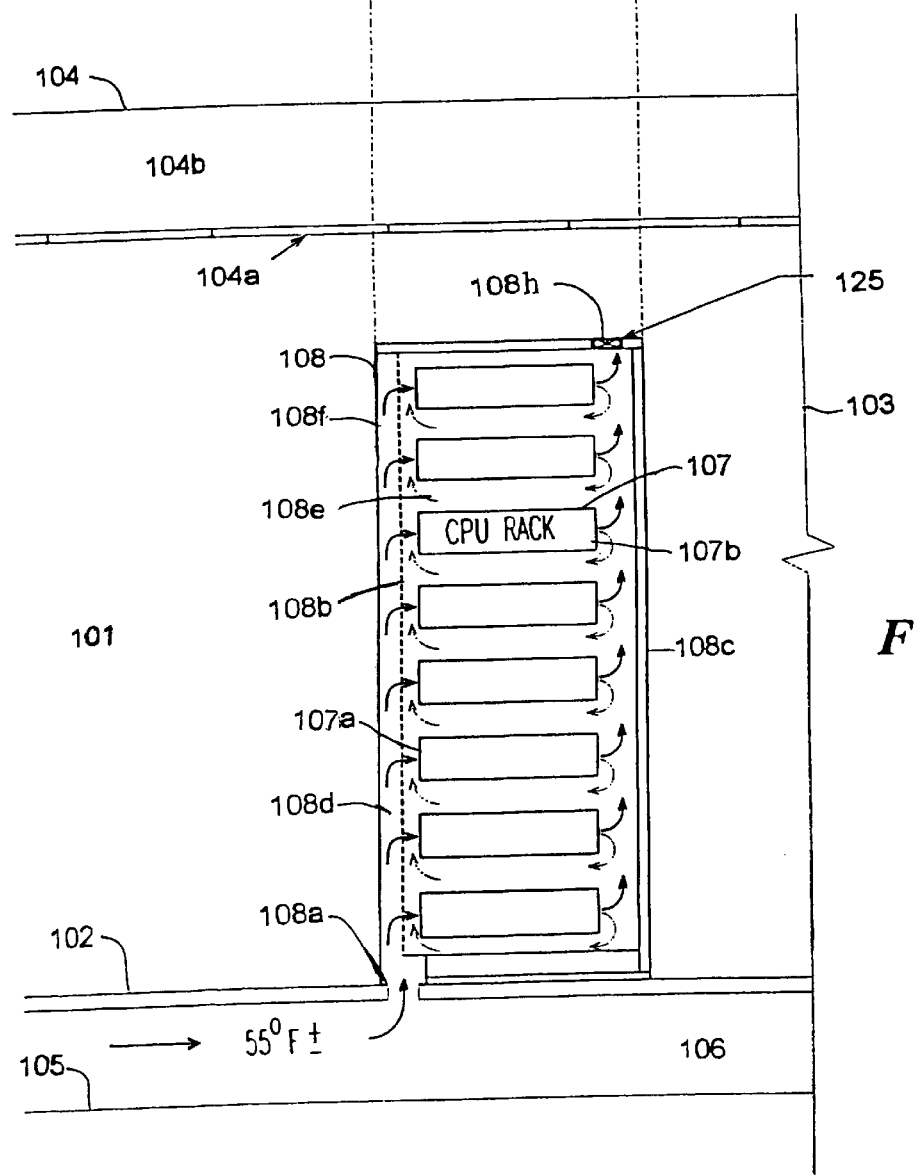

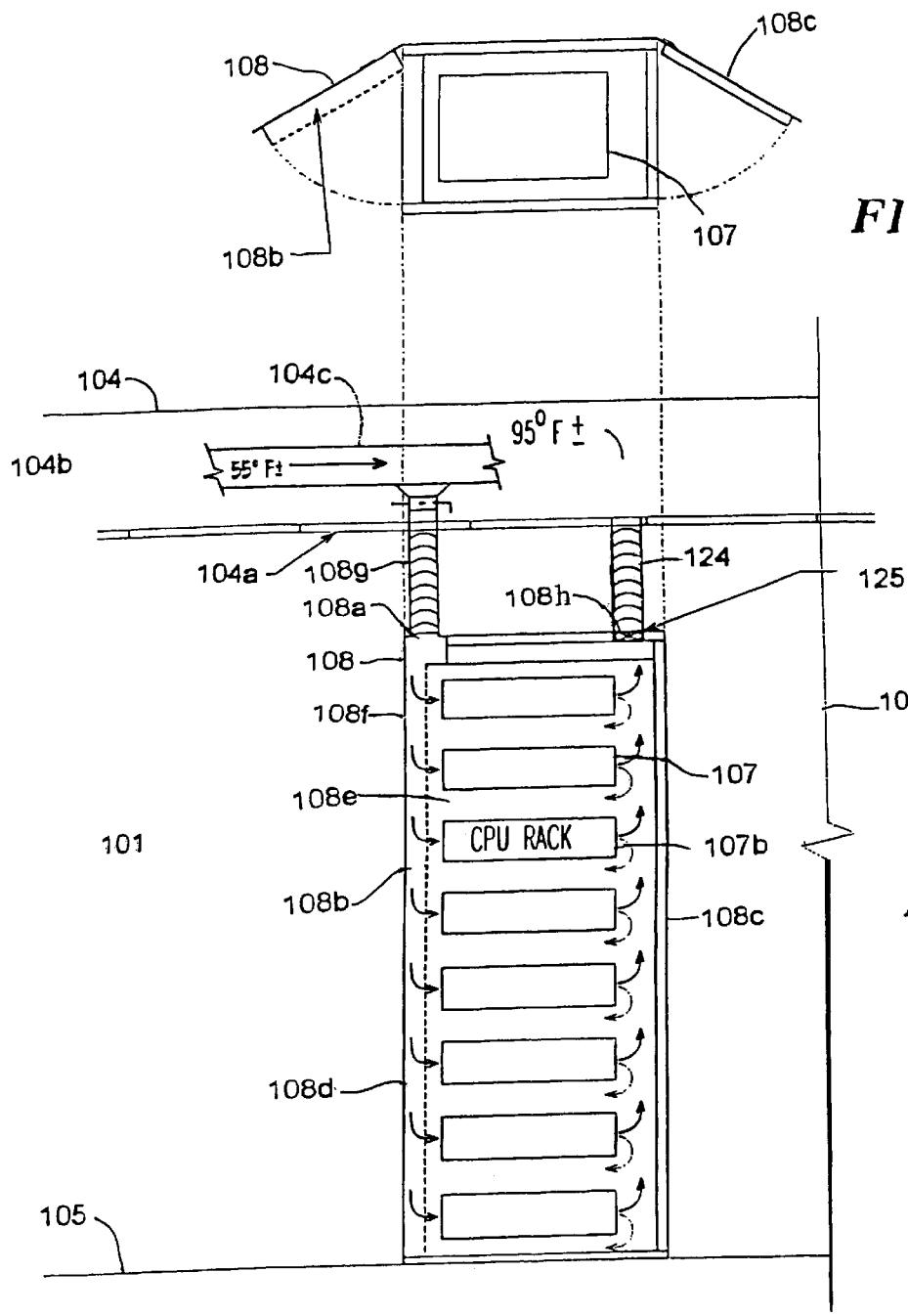

COMPUTER ROOM AIR FLOW METHOD AND APPARATUS

CROSS-REFERENCE TO RELATED APPLICATIONS

The present application claims the benefit of U.S. Provisional Application Serial No. 60/226,887, filed Aug. 23, 2000 and is a continuation-in-part application of U.S. application Ser. No. 09/784,238, filed Feb. 16, 2001 (which claims the benefit of U.S. Provisional Application Serial No. 60/183,328, filed Feb. 18, 2000) and U.S. application Ser. No. 09/842,167 filed Apr. 26, 2001 (which claims the benefit of U.S. Provisional Application Serial No. 60/202,934, filed May 9, 2000), the disclosure of each of which is herein incorporated by reference.

BACKGROUND OF THE INVENTION

1. Field of the Invention

The present invention relates to a computer room reduced air flow method and apparatus but is not limited to use in computer rooms and instead can be utilized with respect to any equipment assembly requiring cooling which is positioned in a room. The method and apparatus described below permits achieving energy savings while reducing the amount of air required to cool electronic/heat generating equipment, wherein a computer rack heat extraction device (CRHED) or similar device is utilized. The method and apparatus permits the collection of heat generating, for example, by the rack electronic equipment.

2. Discussion of the Background

A conventional computer room method and assembly is illustrated in FIG. 3 which exemplifies the approach for cooling electronic equipment commonly used currently wherein an array of racks of equipment are positioned on a raised floor. FIG. 3 illustrates an air-conditioning system used in the method and apparatus of a conventional system wherein a room space 1 defined by a room floor 2, side walls 3 and a ceiling 4 having a plurality of ceiling panels 4a is provided. The room floor 2 is positioned a predetermined distance above a base floor 5 such that the room floor 2 and the base floor 5 in combination form a double floor structure having a free space 6 (i.e., an air passageway) formed therein. A rack 7 for one or more computer processing units (CPUs) is disposed on the floor 2 wherein electronic cables for the rack are capable of being housed in the free space 6 of the double floor structure but can be specifically communicated to the rack separate from the free air space, if desired.

In installing each of the CPUs or other equipment on the rack of the floor, a plurality of support members 2b can be provided which are stationary by being fixed by bolts or similar fastening elements to predetermined positions on the floor 2.

The rack 7 is positioned in a casing 8 having air inlets 8a and air outlets 8b formed respectively in a bottom plate of a casing 8 and in the ceiling portion of the casing 8. A computer case fan 9 is operable during operation of the equipment 7 so as to assist the air flow upwardly from the casing through the air outlets 8b. As shown in FIG. 3, the CPU members are arranged in an air passageway formed within the casing 8. The floor 2 includes a plurality of floor panels located on support members or pedestals 2b, one panel 2a of which includes a plurality of perforations to allow air flow as indicated by the arrows to flow through the front of the outside housing to casing 8, through the CPU rack 7 and out the back of casing 8. A cooling unit 14 is positionable either inside or outside the room 1 and is communicated with a heat exchanger or other air conditioning equipment so as to permit a cooling coil 15 located within unit 14 to cool air blowing there through. The cooling unit 14 also includes a fan 16 which is positionable below cooling coil 15. An inlet 20 is provided to allow air from the room to flow thereinto from the room, the air in the casing 8 mixing with room air prior to being introduced into the cooling unit 14, as illustrated in FIG. 3. The fan 16 is therefore arranged between the air inlet 20 and an air outlet 22 located at the lower portion of unit 14 and feeds air into the free space 6 located above the base floor. The fan 16 thus permits air in the interior of the room to be sucked into the air inlet 20 of the casing 8 and also permits the air in the room to pass through cooling coil 15. The air in the room is typically at a temperature of 75° F.±.

The above-noted approach for cooling electronic equipment thus permits the area in the free space 6 below the raised floor 2 to be used for cable management and also serves as a supply air plenum. The computer room air conditioning units (CRACUs) utilize cooling coil 15 to cool the air. The CRACUs supply conditioned air at approximately 55° F. to the underfloor supply air plenum or free space 6. The floor tiles with perforations or slots to allow air to flow from under the raised floor to above the floor are positionable below or are located adjacent to the rack 7. Other perforated tiles are positionable throughout the room to provide air supply to other heat generating equipment and to maintain the room at an ambient environment.

As illustrated by the arrows in FIG. 3 showing the air flow, the conditioned air is then drawn into the rack 7 by either convection by air flow from perforated panels 2a and/or opening 8a to the casing 8 or by fans 9 located in the top of the racks. The air enters the racks at a temperature of approximately 55° F., is heated by the CPUs or other electronic equipment, and flows upwardly out of the rack at approximately a temperature of 95° F. The warm air leaves the rack and mixes with the conditioned ambient environment of the room 1 which is at a temperature of approximately 75° F., and thus returns to the CRACUs at a temperature of approximately 75° F. as illustrated in FIG. 3.

Before the foregoing, it can be understood that a conventional CRACUs have a 20° delta T (±4° F.) across the cooling coil 15. This is also coincident with the space delta T which is defined as being the difference in temperature between the air supplied to the space and the air returned from such space. The temperature of the air returned from the space is usually coincident with the ambient space temperature such that the return air at 75° F. enters the return on top of the CRACUs, passes along the cooling coil 15 and is discharged at a temperature of substantially 55° F. at the bottom of unit 14 so as to pass into the free space 6. The required air quantity to cool such space is a direct function of the space delta T. The equation set forth below is used to calculate the required air flow or cubic feet per minute (CFM) of air to cool a space:

$$CFM = BTUH/1.08 \times \text{delta } T$$

From the foregoing, it can be appreciated that the disadvantage of the conventional system set forth above requires a significant amount of fan horsepower for operation and thus the need has arisen for reducing the amount of horsepower necessary to operate the fan 16.

Devices of the type described above are exemplified, for example, by U.S. Pat. Nos. 5,718,628; 4,774,631 and 5,910, 045, the disclosure of each of which is herein incorporated by reference, as is the disclosure of parent application Ser. No. 09/784,238, the priority of which has been claimed in the present application.

The original concept by the inventors of the present application is exemplified by FIG. 4 of the present application. Such figure shows an air conditioning system used in a method and apparatus as described in such application. As shown therein, the room space is defined by room floor 2, sidewalls 3 and an upper ceiling 4 wherein a lower ceiling 4a is formed, for example, of ceiling tiles defining, a ceiling plenum 4b, and a base floor 5. The room floor 2 is formed a predetermined distance from the base floor such that the room floor 2 and the base floor 5 collectively form a double floor structure having a free space 6 or air passageway formed therein within which electric cables may also be housed. As shown in FIG. 4, air flow from space 6 can enter one side portion of each of the CPU racks and flow across the same towards a plenum 8c which can run the full length of the equipment assembly so as to permit air to flow across each CPU in the rack and then flow upwardly towards a plurality of ducts 24. The ducts 24 are sealed with respect to the equipment assembly by, for example, rubber gaskets wherein similar rubber gaskets 26 are provided between the duct 24 and the lower ceiling 4a. Also provided are computer case fans 24b and 24c, if desired, to assist in air flow through the ducts 24.

FIG. 1 shows an air conditioning system use in the method and apparatus according to an additional earlier concept also developed by the inventors. As shown therein, the structure corresponding to that described above with regard to FIG. 3 utilizes the same reference numbers. In this regard, it is noted that the embodiment shown in FIG. 2 utilizes an attachment either on the back or top of the computer rack (or cabinet) to collect the warm air from the equipment in the rack. The apparatus as shown in FIG. 1, to the contrary, uses space available within the back and top of the rack for the same purpose wherein the use of the existing space allows for both space and cost efficiencies. The apparatus shown therein utilizes a cavity type front door 8 consisting of a solid outer panel 8f and a perforated plate inner panel 8b. Cooling air from below the raised floor 2 is directed first into an air plenum in the bottom of the rack. From the plenum, the cooling air is directed into the air space or cavity 8d and the door that extends the entire front of the rack 7. The air cavity channels the cool air and distributes the cool air more evenly across the front of the equipment in the rack 7. Therefore, this improvement in the distribution of air allows for more even cooling of the equipment.

The design shown in FIG. 1 also incorporates an air space or cavity 8e between the perforated plate 8b and the front 7a of the equipment 7. This air space 8e allows for some re-circulated air to pass from the back 7b of the rack (i.e., the warm side) to the front 7a of the rack 7 (the cold side). Some recirculation may be required since the internal fans (not shown) in the equipment in the rack 7 may be moving more air than is supplied to the rack from the under-floor system described above. The above-noted design allows for either a single fan or a plurality of fans 25 at the top of the rack to exhaust the heat. The fan or fans 25 may be a single speed, variable speed or adjustable speed type of fan, depending upon the specific need for the device. FIG. 2 illustrates the manner in which perforated panel and the solid panels 8a and 8c at the front and back of the cabinet are pivotable so as to be opened for repair and/or replacement of the equipment in the rack 7. The flow arrow shown in FIG. 5 serves to illustrate the manner in which air flow occurs, including exiting of air into the ceiling plenum 4b.

SUMMARY OF THE INVENTION

An object of the present invention is to provide a method and apparatus which utilizes an increased delta T to reduce the required air quantity, thus resulting in a reduced airflow method and apparatus. Specifically, the present invention utilizes an approximately 40° F. delta T to reduce the CFM by substantially 50%. The substantially 50% reduction in the airflow will serve to effectively correspondingly reduce the required power by substantially 50%, resulting in substantial energy savings. A key element of the method and apparatus is an increase in delta T above what is conventionally used. The present invention is capable of operating in a range of delta T from 25° F. to 45° F. In this regard, it is noted that the use of a 40° F. in the description set forth below is solely exemplary in illustrating the device and greater or lesser temperature variations are possible.

An object of at least one embodiment of the present invention is to provide an air conditioning method and apparatus which utilizes the steps of supplying cooling air generated from a cooling apparatus into an air passageway formed below a floor; guiding the cooling air within the air passageway into an equipment assembly disposed on the floor through an opening located in the floor; communicating the cooling air introduced into the equipment assembly into a plenum and introducing the air released from within the equipment into the plenum for communicating such released air to the cooling apparatus. The method may also include the step of guiding the air from the equipment assembly through at least one duct into the plenum and may include the step of cooling the cooling air generated from the cooling apparatus to a temperature of substantially 55° F. while also heating the air released from the equipment assembly to a temperature of substantially 95° F. prior to introducing such air to the cooling apparatus so as to form a closed loop in terms of cycling of the air through the cooling assembly and the equipment assembly.

A further object of the present invention is to obtain a temperature differential between the air supplied to the air passageway or plenum from the cooling apparatus and the air introduced into the plenum from the equipment assembly so as to be substantially 40° F., thus permitting lower power requirements of the fan utilized to assist flow of the air in the closed loop.

A further object of the present invention is to position the fan between the cooling apparatus and the air passageway so as to permit blowing of the air into the passageway towards the equipment assembly, although it is understood that the fan can be located anywhere within the closed loop so as to assist flow of air between the blowing apparatus and the equipment assembly.

A further object of the present invention is to provide a method and apparatus wherein the cooling assembly is located either within or outside the computer room, the equipment assembly comprising either at least one computer processing unit or other type of processing unit in combination with an additional heat generating equipment or without such equipment. In addition, a further object, of the present invention is to cool equipment assembly generating heat which does or does not include computer equipment.

An additional object of the present invention is to provide an air conditioning assembly for performing the method described above.

An additional object of the present invention is to provide a CPU rack housing with a cavity type front door having a substantially solid outer panel and a perforated plate inner panel so that cooling air from below the raised floor is directed first into an air plenum in the bottom of the rack. From the plenum, the cooling air can be directed into an air space or cavity in the door that extends the entire front of the rack such that the air cavity channels cool air and distributes the cool air more evenly across the front of the equipment in the rack and thus allows for more even cooling of the equipment.

A further object of the present invention is to provide an improved design which incorporates an air space or cavity between the perforated plate and the front of the equipment so that the air space allows for some re-circulated air to pass from the back of the rack (the warm side) to the front of the rack (the cold side).

An additional object of the present invention is to permit either a single fan or a plurality of fans to be positioned at the top of the rack so as to exhaust the heat wherein the fan or fans have a single speed, variable speed or adjustable speed capability, depending upon the specific need for the device.

Another feature of the device is the ability to cool more heat generating electronic equipment in a cabinet than can be cooled with the conventional system. The conventional system as shown in FIG. 3 has been shown to experience overheating of equipment at conditions above 4 KW of name plated heat rejection of electronic equipment per cabinet. A cabinet equipped with the CRHED and associated improvements will effectively cool up to 8 KW of name plated heat rejection of electronic equipment. The ability to cool more equipment in a single cabinet result in more revenue per unit area of a building.

Yet an additional feature of the present invention is to provide a heating and cooling method in accordance with the above-noted objects wherein cooling air is fed to the heat generating electronic equipment in the cabinet by means of a cooling duct in the ceiling which permits air to be fed to the equipment at a temperature of substantially 55° F. which is thermally isolated from the remaining volume of the ceiling plenum itself which permits return of air via a duct from the heating equipment at a temperature of substantially 95° and which is returned to the heating and air conditioning system described above. This permits the cooling air to be fed to the equipment via the ceiling rather than via than the plenum provided beneath the floor and above the base floor.

It is yet an additional object of the present invention to provide a method and apparatus described in the foregoing paragraph but wherein the air upon being heated is returned via one or more fans from the electronic equipment and the heat is released into the room for return to the heating and air conditioning assembly. This embodiment permits the cooled air plenum provided in the ceiling duct to communicate cooled air at a temperature of substantially 55° F. into the equipment via a duct which permits heated air from the heat generating electronic equipment to exit from the cabinet of the equipment into the ceiling for return to the heating and air conditioning system for being cooled to a temperature of substantially 55° by the cooling unit 14 so as to complete the cycle of flow of air to and from the heat generating electronic equipment in the cabinet.

BRIEF DESCRIPTION OF THE DRAWINGS

Various features, objects and attendant advantages of the preferred embodiments are illustrated in the figures of the present application which serve to explain the principles of the invention, wherein:

FIG. 5 illustrates an air conditioning method and apparatus according to the present invention;

FIG. 6 is a top view of the structure shown in FIG. 5, which illustrates the capability of the panels to be pivotable on the cabinet.

FIG. 7 illustrates a second embodiment of the air conditioning method and apparatus in accordance with the present invention.

FIG. 8 is a top view of the structure shown in FIG. 7, which illustrates the capability of the panels to be pivotable on the cabinet.

DESCRIPTION OF THE PREFERRED EMBODIMENTS

Figure 2:
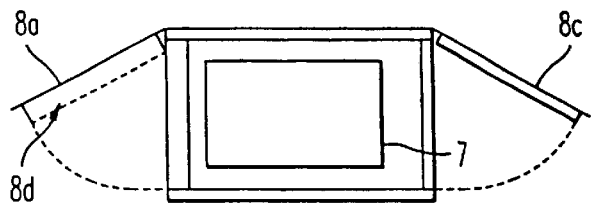
FIG. 2 is a top view of the structure shown in FIG. 1, which illustrates the capability of the panels to be pivotable on the cabinet.
Figure 1:
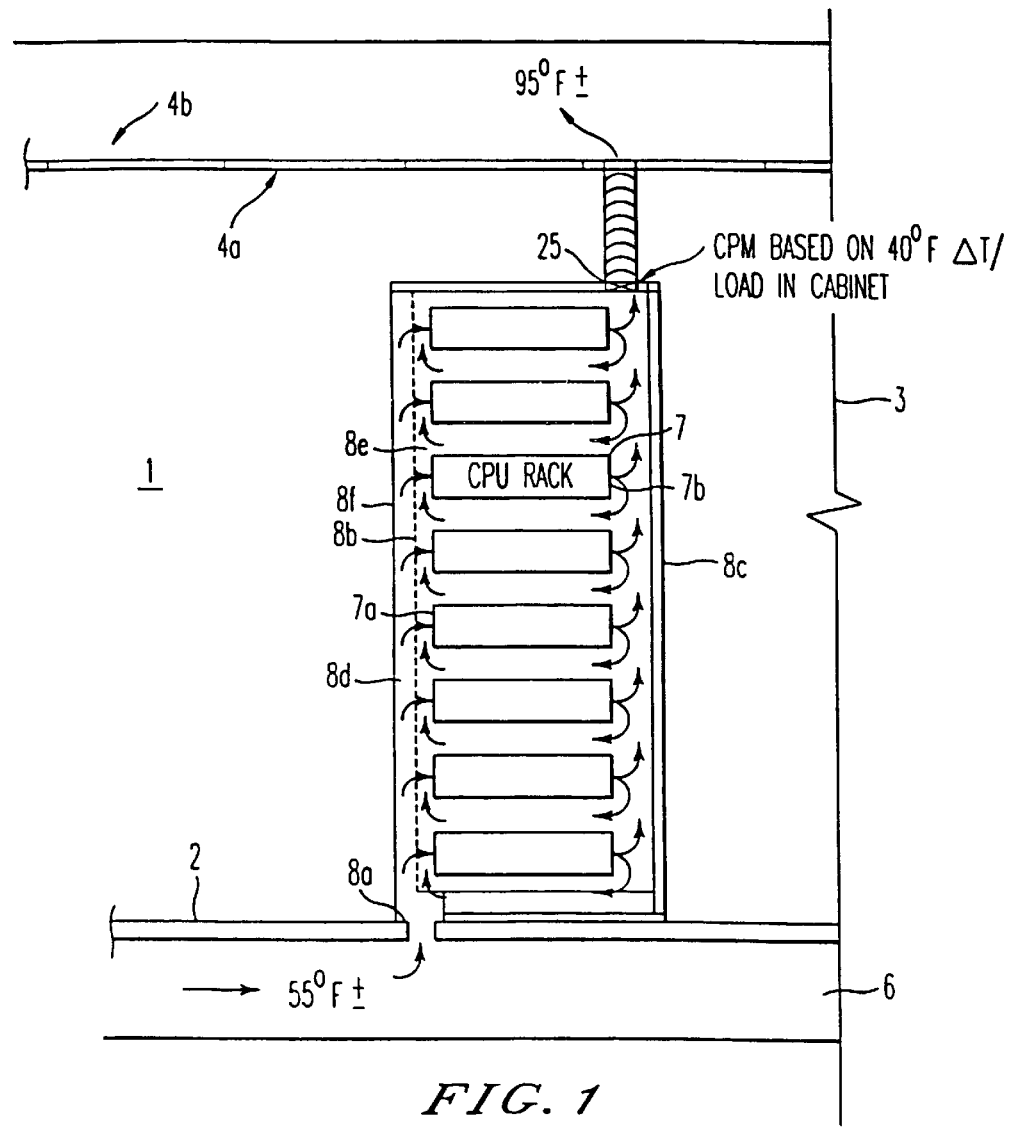
FIG. 1 illustrates an air conditioning method and apparatus used in an embodiment of the present invention previously developed by the inventors.
Figure 3:
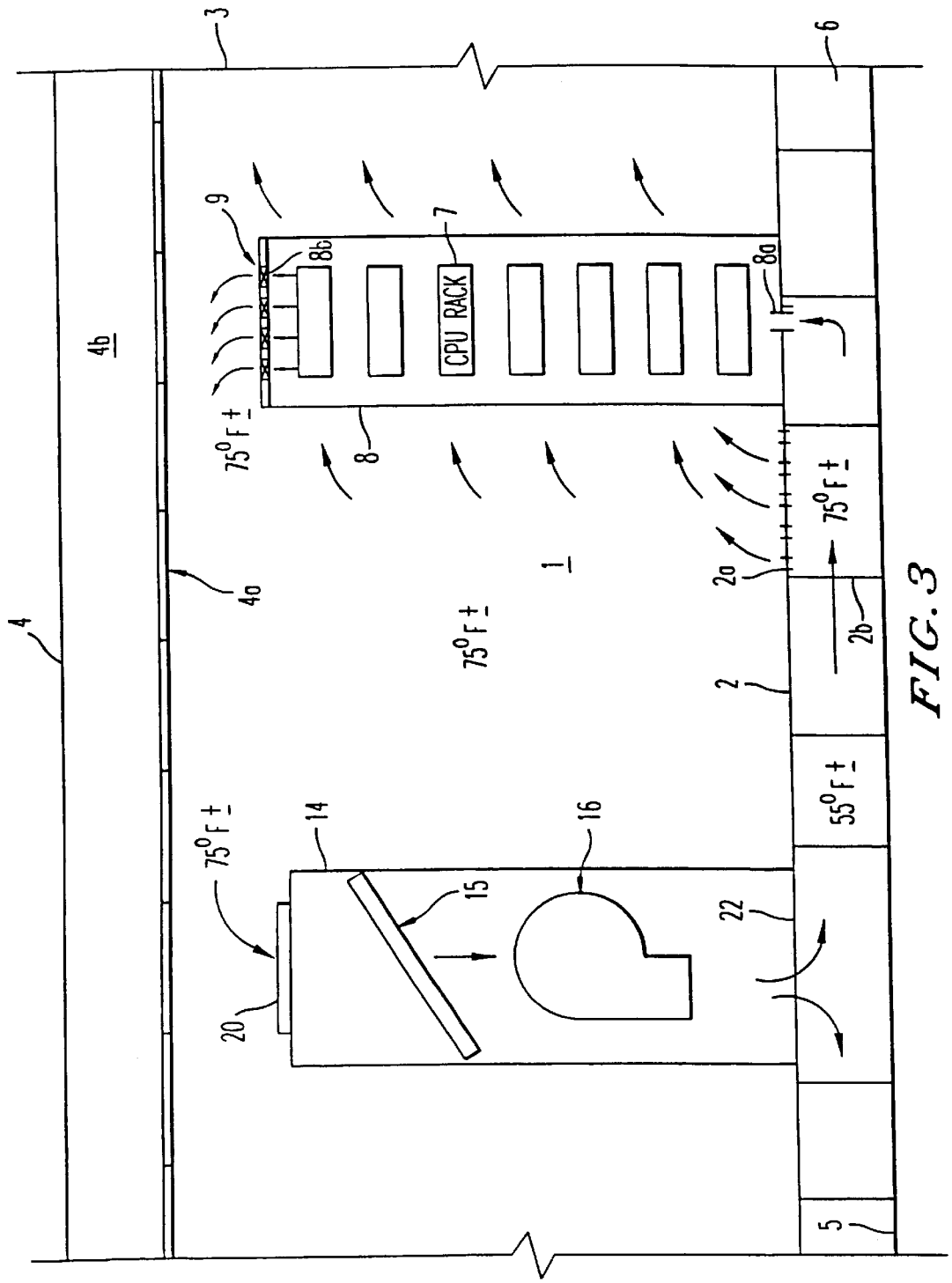
FIG. 3 illustrates a conventional air conditioning method and apparatus.

FIGS. 5 and 6 illustrate the first embodiment in accordance with the present invention wherein structure similar to that shown in FIGS. 1–4 is illustrated using the same reference number but in a 100 series. FIGS. 5 and 6 serve to illustrate the air-conditioning system used in the method and apparatus of the present invention wherein a room space 101 is defined by a floor 102, side walls 103 and a ceiling 104 having a plurality of ceiling panels 104a. The room floor 102 is positioned a predetermined distance above the base floor 105 such that the room floor 102 and base floor 105 in combination form a double floor structure having a free space 106 (i.e. air passageway) formed therein. A rack 107 for one or more computer processing units (CPUs) is disposed in a casing 108 located on the floor 102 wherein electronic cables for the rack are capable of being housed in the free space 106 of the double floor structure but can be specifically communicated through the rack 107 separate from the free air space, if desired.

In installing each of the CPUs or other equipment on the rack on the floor, a plurality of support members can be provided which are stationary by being fixed by bolts or similar fastening elements to the predetermined positions on the floor 102.

Figure 4:
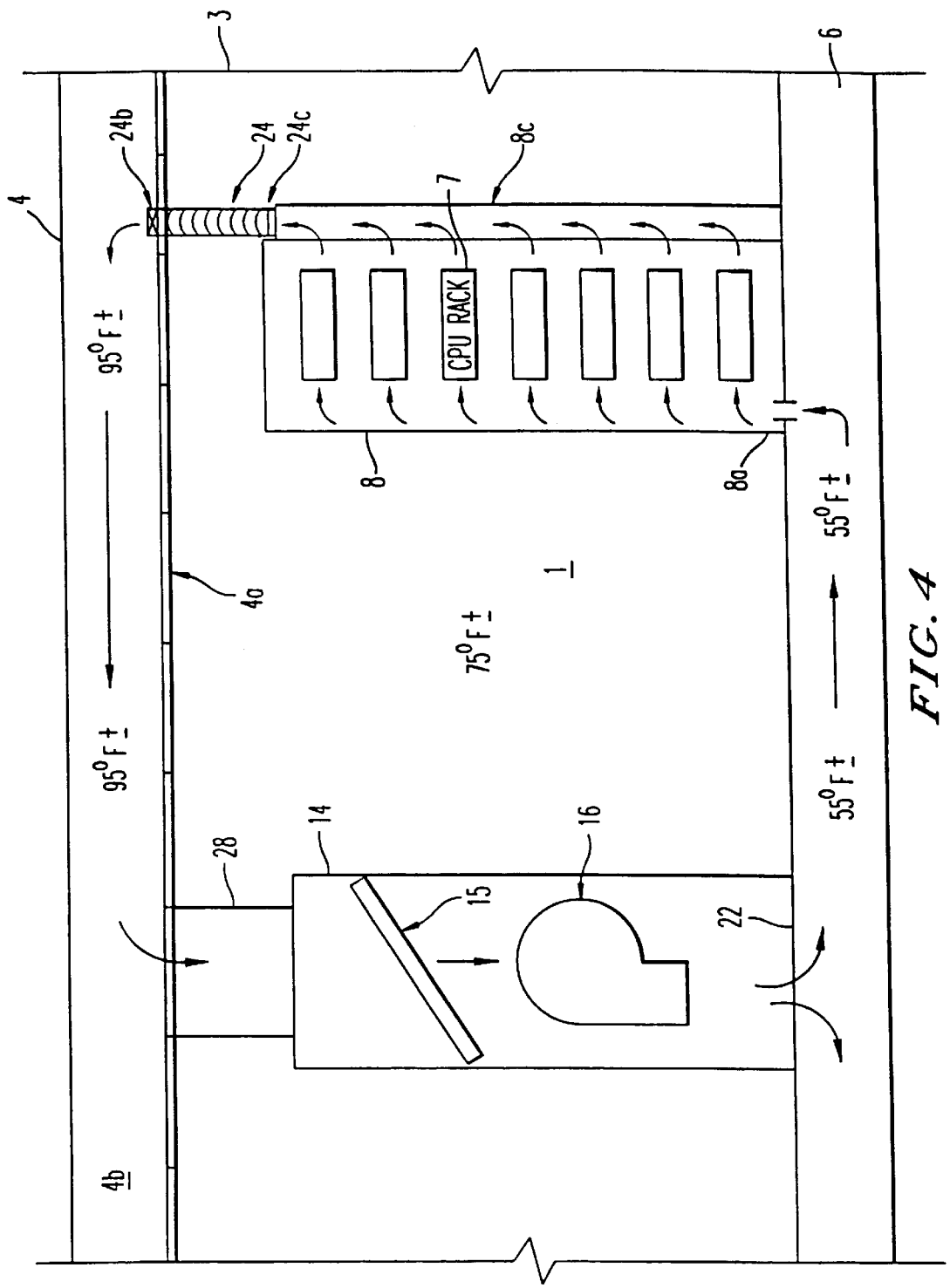
FIG. 4 illustrates a concept of the inventors designed for an air conditioning method and apparatus which was developed subsequent to the initial embodiment shown in FIG. 1.

The rack 107 is positioned in the casing 108 has the casing is provided with air inlets 108a and air outlets 108h. A computer case fan 125 is operable during operation of the rack 107 so as to assist the flow upwardly from the casing through the air outlets 108h. A cooling unit similar to that of cooling unit 14 illustrated in FIG. 4 is positionable either inside or outside the room 101 and is communicated with a heat exchange or other air conditioning equipment as previously described so as to permit the cooling coil 15 located within the unit 14 to cool air blowing therethrough. The cooling unit 14 also includes a fan 16 which is positionable below cooling coil 15 as shown in FIG. 4. Also shown in FIGS. 5 and 6 is the casing 108, inlet 108a in the form of an opening in the bottom part of the equipment for permitting air at substantially 55° to flow into the equipment, a perforated plate inner panel 108b, a rear wall 108c of the casing 108, and an air space or cavity 108d located between panel 108b and the outer wall of the casing 108 and room space 101. In addition, a single fan or plurality of fans 125 is provided at opening 108h.

Figure 9:
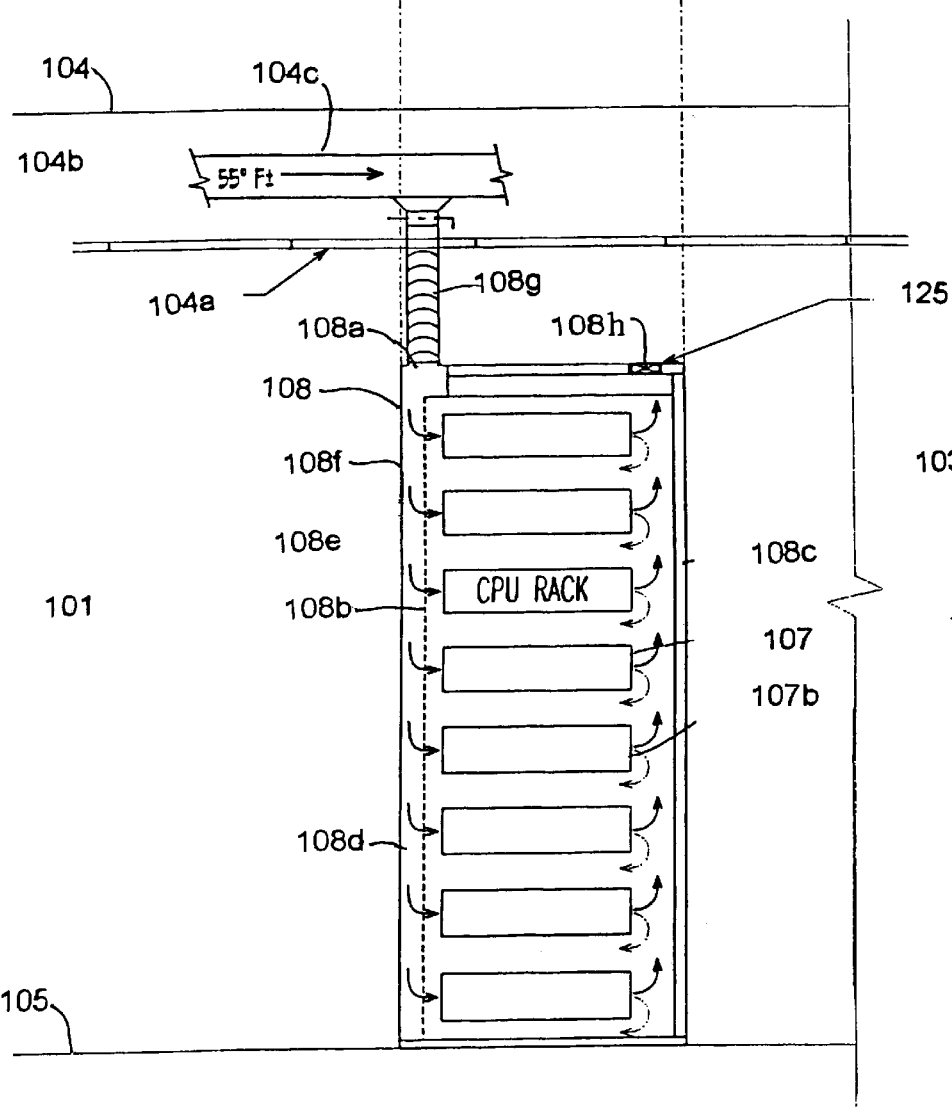
FIG. 9 illustrates a third embodiment of the air conditioning method and apparatus used in the present invention.

The embodiment shown in FIGS. 5 and 6 allows for heat rejected from the rack to be ventilated directly into the space of the computer room and allows the rack to be used in existing computer rooms. This improvement as well as the improvement shown in FIGS. 7–9 provide an improvement to the original design conceived by the present inventors and permits venting the heat directly into the room and supplying the air into the top or bottom portion of the computer room. Alternatively, as shown in FIGS. 7–8, the air can be returned to a ceiling plenum 104b to complete the air conditioning cycle.

The second embodiment of the present invention is shown in FIGS. 7 and 8 wherein an additional duct 104c is provided for directly communicating cooled air at a temperature of substantially 55° to an additional duct 108g that directly leads into an opening 108a formed in the upper portion of the casing 108 as illustrated in FIG. 7. This permits air to flow downwardly and then pass through the perforated screen or plate 108b where the air is recycled back to the entrance portion 107a of the CPU rack and then subsequently be let out the outlet portion 107b thereof and to flow upwardly through opening 108h via the use of one or more fans 125 and then to flow into duct 124 for communication of such heated air at a temperature of substantially 95° F. back into plenum 104b for return of the cooling unit 14 illustrated in FIG. 4 of the present invention. As can be appreciated from a review of FIGS. 7 and 8, such differs from previous embodiments in that casing 108 can be positioned on the base floor 105 since no cooling air need flow through the bottom portion thereof. However, as can be contemplated by one of ordinary skill in the art, it would be possible to provide a similar plenum to that of 104c and to place it within a free space 106 as shown in FIG. 5 so as to supplement the heating and cooling accomplished in the manner shown in FIGS. 7 and 8.

Figure 10:
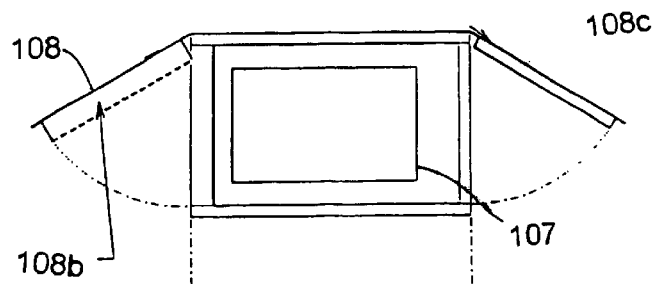
FIG. 10 is a top view of the structure shown in FIG. 9, which illustrates the capability of the panels to be pivotable on the cabinet.

The third embodiment shown in FIGS. 9 and 10 of the present invention includes a duct 104c similar to that of FIGS. 7 and 8 but wherein duct 125 is removed and that, instead, a fan or plurality of fans 125 permit the heated air to be returned directly into the computer room 101 wherein the air exiting from the casing 108 exits with a CFM based upon a 40° F. ΔT load in cabinet 108.

Additional advantages and modifications readily occur to those skilled in the art. Therefore, the invention in its broader aspects is not limited to the specific details discussed above, and the illustrated examples shown and described therein may be formed of structurally equivalent elements. Accordingly, various modifications may be made without departing from the spirit or scope of the general inventive concept as defined by the appended claims and their equivalents.

What is claimed is:

1. An air conditioning method, comprising the steps of:
   supplying cooling air generated from a cooling apparatus into an air passageway;
   guiding the cooling air within the air passageway into an equipment assembly positionable on a floor of a room through an opening located in the equipment assembly;
   communicating the cooling air from the equipment assembly into a plenum separated from the room;
   positioning an air flow control member in the equipment assembly so as to substantially evenly distribute cooling air to the equipment located in the equipment assembly; and
   communicating the air released from said equipment into said plenum and back to the cooling apparatus for being communicated through the cooling apparatus for cooling the released air.

2. A method as claimed in claim 1, which comprises guiding the air released from the equipment assembly through at least one duct into said plenum.

3. The method according to claim 2, which comprises at least one fan for communicating the cooling air into said plenum.

4. The method as claimed in claim 1, which comprises cooling the cooling air generated from the cooling apparatus to a temperature of substantially 55° F.

5. The method according to claim 4, which comprises heating the air released from the equipment assembly to a temperature of substantially 95° F. prior to communicating such air to the cooling apparatus.

6. The method according to claim 1, wherein a temperature differential between the air supplied to the air passageway from the cooling apparatus and the air released from the equipment assembly is substantially 40° F.

7. The method according to claim 1, which comprises positioning a fan between the cooling apparatus and the equipment assembly and blowing the air into the equipment assembly by said fan.

8. The method according to claim 1, which comprises positioning at least one of the cooling apparatus and the equipment assembly in a computer room.

9. The method according to claim 1, wherein the room comprises a computer room and wherein the cooling assembly is located outside the computer room.

10. The method according to claim 1, wherein said equipment assembly comprises at least one computer processing unit.

11. An air conditioning assembly, which comprises:
    a cooling apparatus in communication with an air passageway for introducing cooling air into the passageway;
    an equipment assembly positionable on a floor of a room, the equipment having an opening in communication with said air passageway for receiving the cooling air from the cooling apparatus;
    a flow control member positioned upstream of said equipment assembly so as to substantially evenly distribute the cooling air to the equipment assembly; and
    communication means separated from the room and being in communication with the equipment assembly for receiving air flowing from the equipment assembly which has been heated by the equipment assembly, said communication means communicating the air heated by the equipment assembly back to the cooling apparatus for being cooled.

12. An air conditioning assembly as claimed in claim 11, which comprises at least one duct interconnecting the equipment assembly to the communication means for communicating air heated by the cooling equipment to the cooling assembly.

13. The air conditioning assembly as claimed in claim 11, which comprises at least one fan for communicating the heated air to the plenum.

14. An air conditioning assembly as claimed in claim 11, wherein the cooling apparatus cools the cooling air to a temperature of substantially 55° F.

15. The air conditioning assembly as claimed in claim 11, wherein the equipment apparatus heats the air blowing into the plenum to a temperature of substantially 95° F.

16. The air conditioning assembly according to claim 11, wherein a temperature differential between the air supplied to the equipment apparatus and the air introduced into the communication means from the equipment assembly is substantially 40° F.

17. The method as claimed in claim 1, which comprises positioning the equipment assembly in a cabinet and positioning the flow control member in said cabinet upstream of said equipment so as to control air flow to said equipment.

18. The cooling apparatus as claimed in claim 11, which comprises a cabinet within which the equipment assembly is located and wherein the control member is positioned so as to be spaced from a wall of the cabinet so as to form a space within which the cooling air is communicated prior to being received by the equipment assembly.

19. An air conditioning assembly as claimed in claim 11, wherein the equipment assembly comprises at least one computer processing unit.

20. The apparatus according to claim 11, wherein said communication means comprises one of a plenum, a duct and a room.

21. The cooling method claimed in claim 1, wherein the communication of air from the equipment comprises communicating the air into one of a plenum, a duct and a room.

22. The cooling method according to claim 1, which comprises positioning said air passageway in proximity with the floor of a room.

23. The cooling method claimed in claim 1, wherein the step of supply cooling air comprises supplying cooling air into a passageway formed below a floor on which the equipment assembly is positioned.

24. The cooling apparatus according to claim 11, wherein said air passageway is positioned in proximity with the floor.

25. The cooling apparatus according to claim 11, wherein said air passageway is positioned with a plenum formed between the floor and a base floor.

26. An air conditioning assembly, which comprises:
   cooling means in communication with an air passageway for introducing cooling air into said air passageway;
   an equipment assembly positionable on a floor of a room, the equipment having an opening in communication with said air passageway for receiving the cooling air from the cooling means;
   a flow control member positionable upstream of said equipment assembly so as to substantially evenly distribute the cooling air to the equipment assembly; and
   communication means in communication with the equipment assembly and separated from the room for receiving air flowing from the equipment assembly which has been heated by the equipment assembly, said communication means communicating the air heated by the equipment assembly back to the cooling apparatus for being cooled.

27. An air conditioning assembly as claimed in claim 26, which comprises at least one duct means interconnecting the equipment assembly to the communication means for communicating air heated by the cooling equipment to the cooling assembly.

28. The air conditioning assembly according to claim 26, which comprises at least one fan for communicating the heated air to the plenum.

29. An air conditioning assembly as claimed in claim 26, wherein the cooling apparatus cools the cooling air to a temperature of substantially 55° F.

30. The air conditioning assembly as claimed in claim 26, wherein the equipment apparatus heats the air blowing into the plenum to a temperature of substantially 95° F.

31. The air conditioning assembly according to claim 26, wherein a temperature differential between the air supplied to the equipment apparatus and the air introduced into the communication means from the equipment assembly is substantially 40° F.

32. The method as claimed in claim 1, which comprises positioning the equipment assembly in cabinet means and positioning the flow control member in said cabinet means upstream of said equipment so as to control air flow to said equipment.

33. The cooling apparatus as claimed in claim 26, which comprises cabinet means within which the equipment assembly is located and wherein the control member is positionable so as to be spaced from a wall of the cabinet so as to form a space within which the cooling air is communicated prior to being received by the equipment assembly.

34. An air conditioning assembly as claimed in claim 11, wherein the equipment assembly comprises at least one computer processing means.

35. The apparatus according to claim 26, wherein said communication means comprises one of a plenum, a duct and a room.

36. The cooling method as claimed in claim 1, wherein the step of cooling air comprises supplying cooling air into passageway means formed below a floor on which the equipment assembly is positioned.

37. An air conditioning method, comprising the steps of:
   supplying cooling air generated from a cooling apparatus into an air passageway;
   guiding the cooling air within the air passageway into an equipment assembly positionable on a floor of a room via a supply duct;
   positioning an air flow control member in the equipment assembly so as to substantially evenly distribute cooling air to the equipment located in the equipment assembly; and
   introducing the air released from said equipment assembly into a plenum separated from the room and communicating the released air through the cooling apparatus via said plenum for cooling the released air.

38. The method as claimed in claim 35, which comprises positioning at least one of said supply duct and plenum above a ceiling portion of a room and guiding the air released from said equipment assembly through said at least one duct into the plenum.

39. The method according to claim 38, which comprises positioning each of said supply duct and plenum above said ceiling for communicating the cooling air into said plenum by operation of at least one fan.

40. The method as claimed in claim 37, which comprises positioning said air passageway in proximity with a ceiling portion of a room and cooling the cooling air generated from the cooling apparatus to a temperature of substantially 55° F.

41. The method according to claim 40, which comprises heating the air released from the equipment assembly to a temperature of substantially 95° F. prior to communicating the air to a cooling apparatus.

42. The method according to claim 37, wherein a temperature differential between the air supply to the air passageway from the cooling apparatus and the air released into the first plenum from the equipment assembly is substantially 40° F.

43. The method according to claim 37, which comprises positioning the fan between the cooling apparatus and the air passageway and blowing the air into the passageway towards the equipment assembly by said fan.

44. The method according to claim 37, which comprises positioning at least one of the equipment assembly and the cooling apparatus in a computer room.

45. The method according to claim 37, wherein the room comprises a computer room and wherein the cooling assembly is located outside the computer room.

46. The method according to claim 37, wherein said equipment assembly comprises at least one computer processing unit.

47. An air conditioning assembly for a room, which comprises:
    a cooling apparatus in communication with an air passageway for introducing cooling air into the passageway;
    an equipment assembly positionable on a floor of the room, the equipment having an opening in communication with the air passageway for receiving the cooling air from the cooling apparatus;
    a flow control member positioned upstream of said equipment so as to substantially evenly distribute the cooling air to the equipment assembly; and
    a plenum separated from the room and in communication with the equipment assembly for receiving air flowing from the equipment assembly which has been heated by the equipment assembly, said first plenum communicating the air heated by the equipment assembly back to the cooling apparatus for being cooled.

48. An air conditioning assembly as claimed in claim 47, which comprises at least one duct interconnecting the equipment assembly to the plenum for communicating air heated by the cooling equipment into the plenum for being returned to the cooling assembly.

49. The air conditioning assembly as claimed in claim 47, first comprises at least one fan for communicating the heated air to the plenum.

50. An air conditioning assembly as claimed in claim 47, which comprises a supply duct for communicating cooling air from the cooling apparatus to the equipment assembly wherein the cooling apparatus cools the cooling air to the temperature of substantially 55° F.

51. The air conditioning assembly as claimed in claim 47, wherein the equipment apparatus heats the air blowing into the plenum to a temperature of substantially 95° F.

52. The air conditioning assembly according to claim 47, wherein a temperature differential between the air supply to the air passageway and the air introduced into the plenum from the equipment assembly is substantially 40° F.

53. A method as claimed in claim 37, which comprises positioning the equipment assembly in a cabinet and positioning the flow control member in said cabinet upstream of said equipment so as to control air flow to said equipment.

54. A cooling apparatus as claimed in claim 47, which comprises a cabinet within which the equipment assembly is located and wherein the control member is positioned so as to be spaced from a wall of the cabinet so as to form a space within which the cooling air is communicated prior to being received by the equipment assembly.

55. An air conditioning assembly as claimed in claim 11, wherein the equipment assembly comprises at least one computer processing unit.

56. An air conditioning assembly as claimed in claim 50, wherein at least one of said supply duct and plenum is located above a ceiling portion of a room.

57. An air conditioning assembly as claimed in claim 56, wherein each of said supply duct and plenum are located above the ceiling portion of the room.

58. An air conditioning assembly, which comprises:
    cooling means in communication with the near passageway for introducing cooling air into the passageway;
    an equipment assembly positioned on a floor of a room, the equipment having an opening in communication with the air passageway for receiving the cooling air from the cooling apparatus;
    flow control means positioned upstream of said equipment assembly so as to substantially evenly distribute the cooling air to the equipment assembly; and
    plenum means separated from the room and in communication with equipment assembly for receiving air flowing from the equipment assembly which has been heated by the equipment assembly, said plenum means communicating the air heated by the equipment assembly back to the cooling apparatus for being cooled.

59. An air conditioning assembly as claimed in claim 58, which comprises at least one duct interconnecting the equipment assembly to the plenum means for communicating air heated by the cooling equipment into the plenum means for return to the cooling assembly.

60. The air conditioning assembly as claimed in claim 58, which comprises at least one fan for communicating the heated air to the plenum.

61. The air conditioning assembly as claimed in claim 58, which comprises a supply duct for communicating cooling air from the cooling apparatus to the equipment assembly wherein the cooling apparatus cools the cooling air to a temperature of substantially 55° F.

62. The air conditioning assembly as claimed in claim 58, wherein the equipment apparatus heats the air blowing into the plenum to a temperature of substantially 95° F.

63. The air conditioning assembly according to claim 58, wherein a temperature differential between air supply to the air passageway and the air introduced into the plenum from the equipment assembly is substantially 40° F.

64. The method as claimed in claim 37, which comprises positioning the equipment assembly in cabinet means and positioning the flow control member in said cabinet means upstream of said equipment so as to control air flow to said equipment.

65. The cooling apparatus as claimed in claim 58, which comprises cabinet means within which the equipment assembly is located wherein the control member is positioned so as to be spaced from the wall of the cabinet means so as to form a space within which the cooling air is communicated prior to being received by the equipment assembly.

66. An air conditioning assembly as claimed in claim 58, wherein the equipment assembly comprises at least one computer processing means.

67. An air conditioning assembly as claimed in claim 58, where at least one of said supply duct and plenum means is located above a ceiling portion of a room.

68. An air conditioning assembly as claimed in claim 67, wherein each of said supply duct and plenum means are located above the ceiling portion of the room.

69. An air conditioning method, comprising the steps of:
    supplying cooling air generated from a cooling apparatus into an air passageway;
    guiding the cooling air within the air passageway and into an equipment assembly positionable on a floor of a room through an opening therein via a plenum;

positioning an air flow control member in the equipment assembly so as to substantially evenly distribute cooling air to the equipment located in the equipment assembly; and separating the air released from said equipment from air within the room in which the equipment assembly is positionable and communicating the released air through the cooling apparatus for cooling the released air.

70. A method as claimed in claim 69, which comprises guiding the air released from the equipment assembly into the room via an opening formed in the equipment assembly.

71. The method according to claim 70, which comprises communicating the cooling air into the equipment assembly by operation of at least one fan.

72. The method as claimed in claim 69, which comprises cooling the cooling air generated from the cooling apparatus to a temperature of substantially 55° F.

73. The method according to claim 72, which comprises heating the air released from the equipment assembly to a temperature of substantially 95° F. prior to communicating such air to the cooling apparatus.

74. The method according to claim 69, wherein a temperature differential between the air supplied to the air passageway from the cooling apparatus and the air released into the plenum from the equipment assembly is substantially 40° F.

75. The method according to claim 69, which comprises positioning a fan between the cooling apparatus and the equipment assembly and blowing the air into the air passageway towards the equipment assembly by said fan.

76. The method according to claim 69, wherein the room comprises a computer room and wherein the at least one of the cooling apparatus and equipment assembly are positioned in the computer room.

77. The method according to claim 69, wherein the room comprises a computer room, wherein the cooling assembly is located outside the computer room.

78. The method according to claim 69, wherein said equipment assembly comprises at least one computer processing unit.

79. An air conditioning assembly, which comprises:
a cooling apparatus in communication with an air passageway for introducing cooling air into the passageway;

an equipment assembly positionable on a floor of a room, the equipment having an opening formed therein in communication with the air passageway for receiving the cooling air from the cooling apparatus;

a flow control member positioned upstream of said equipment assembly so as to substantially evenly distribute the cooling air to the equipment assembly; and an outlet member formed in the equipment assembly for receiving air flowing from the equipment assembly which has been heated by the equipment assembly and separating the air heated by the equipment assembly from air located in the room, said outlet member communicating the air heated by the equipment assembly back to the cooling apparatus for being cooled.

80. An air conditioning assembly as claimed in claim 79, the passageway including a plenum and which comprises at least one duct interconnecting the equipment assembly to the plenum for communicating cooling air thereto from the cooling assembly.

81. The air conditioning assembly as claimed in claim 79, which comprises at least one fan for communicating the heated air to the plenum.

82. An air conditioning assembly as claimed in claim 79, wherein the cooling apparatus cools the cooling air to a temperature of substantially 55° F.

83. The air conditioning assembly as claimed in claim 79, wherein the equipment apparatus heats the air blowing into the plenum to a temperature of substantially 95° F.

84. The air conditioning assembly according to claim 79, wherein a temperature differential between the air supply to the air passageway and the air introduced into the plenum from the equipment assembly is substantially 40° F.

85. The method as claimed in claim 69, which comprises positioning the equipment assembly in a cabinet and positioning the flow control member in said cabinet upstream of said equipment so as to control air flow to said equipment.

86. The cooling apparatus as claimed in claim 79, which comprises a cabinet within which the equipment assembly is located and wherein the control member is positioned so as to be spaced from a wall of the cabinet so as to form a space within which the cooling air is communicated prior to being received by the equipment assembly.

87. An air conditioning assembly as claimed in claim 79, wherein the equipment assembly comprises at least one computer processing unit.

88. An air conditioning assembly as claimed in claim 79, wherein said plenum is positioned with a ceiling portion of a room within which the equipment is positioned.

89. An air conditioning assembly, which comprises:
cooling means in communication with an air passageway for introducing cooling air into the passageway;

an equipment assembly positionable on a floor of a room, the equipment having an opening in communication with the air passageway for receiving the cooling from the cooling means;

flow control means positioned upstream of said equipment assembly so as to substantially evenly distribute the cooling air to the equipment assembly; and outlet means provided in the equipment assembly for receiving air flowing from the equipment assembly which has been heated by the equipment assembly and separating the air heated by the equipment assembly from air within the room, said outlet means communicating the air heated by the equipment assembly back to the cooling apparatus for being cooled.

90. An air conditioning assembly as claimed in claim 89, the passageway including plenum means and which comprises at least one duct interconnecting the equipment assembly to the plenum means for communicating cooling air from the cooling assembly.

91. The air conditioning assembly as claimed in claim 79, which comprises at least one fan means for communicating the heating air from the outlet means wherein the cooling apparatus cools the cooling air to a temperature of substantially 55° F.

92. The air conditioning assembly as claimed in claim 89, wherein the equipment apparatus heats the air blowing from the outlet means to a temperature of substantially 95° F.

93. The air conditioning assembly according to claim 89, wherein a temperature differential between the air supply to the air passageway and the air communicated from the outlet means from the equipment assembly is substantially 40° F.

94. A method as claimed in claim 89, which comprises positioning the equipment assembly in cabinet means and positioning the flow control means and said cabinet means upstream of said equipment so as to control air flow to said equipment.

95. The cooling apparatus as claimed in claim 89, which comprises cabinet means within which the equipment assembly is located and wherein the flow control means is positioned so as to be spaced from a wall of the cabinet means so as to form a space within which the cooling air is communicated prior to being received by the equipment assembly.

96. An air conditioning assembly as claimed in claim 89, wherein the equipment assembly comprises at least one computer processing unit.

97. An air conditioning assembly as claimed in claim 79, wherein said outlet means is in communication with a ceiling portion of a room within which the equipment assembly is positioned.

98. An air conditioning method, comprising the steps of:
   supplying cooling air generated from a cooling apparatus into an air passageway;
   guiding the cooling air within the air passageway and into an equipment assembly, positionable on a floor of a room, via a plenum;
   communicating the cooling air introduced into the equipment assembly into said plenum; and
   introducing the air released into the plenum from within said equipment into the plenum and communicating the released air while separating the released air from air within the room, to one of a position for being communicated back through the cooling apparatus for cooling the released air and being communicated to a position remote from the room.

99. The method as claimed in claim 98, which comprises guiding the air released from the equipment assembly through at least one opening in the equipment assembly.

100. The method according to claim 99, which comprises communicating the cooling air into said plenum by operation of at least one fan.

101. The method as claimed in claim 98, which comprises cooling the cooling air generated from the cooling apparatus to a temperature of substantially 55° F.

102. The method according to claim 101, which comprises heating the air released from the equipment assembly to a temperature of substantially 95° F. prior to communicating the air to the cooling apparatus.

103. The method according to claim 98, wherein a temperature differential between the air supply to the air passageway from the cooling apparatus and the air released from the equipment assembly is substantially 40° F.

104. The method according to claim 98, which comprises positioning a fan between the cooling apparatus and the air passageway and blowing the air into the passageway toward the equipment assembly by said fan.

105. The method according to claim 98, wherein the room comprises a computer room and wherein at least one of the cooling apparatus and the equipment assembly are positioned in the computer room.

106. The method according to claim 98, wherein the room comprises a computer room and wherein the cooling assembly is located outside the computer room.

107. A method according to claim 98, wherein said equipment assembly comprises at least one computer processing unit.

108. A method according to claim 98, which comprises positioning an air flow control member in the equipment assembly so as to substantially evenly distribute cooling air to the equipment located in the equipment assembly.

109. An air conditioning assembly, which comprises:
   a cooling apparatus in communication with an air passageway of the room for introducing cooling air into the passageway;
   an equipment assembly positioned on a floor of a room, the equipment having an opening in communication with the air passageway for receiving the cooling air from the cooling apparatus;
   a duct separated from the room and which is in communication with the air passageway for receiving air blowing from the equipment assembly which has been heated by the equipment assembly, said duct communicating the air heated by the equipment assembly to one of a position at which the cooling apparatus is located and a position remote from the room.

110. An air conditioning assembly as claimed in claim 109, which comprises at least one duct opening positioned in the equipment assembly for communicating air heated by the equipment assembly into a room in which the cooling apparatus is located.

111. The air conditioning assembly as claimed in claim 109, which comprises at least one fan for communicating the heated air to the plenum.

112. The air conditioning assembly as claimed in claim 109, wherein the cooling apparatus cools the cooling air to a temperature of substantially 55° F.

113. The air conditioning assembly as claimed in claim 109, wherein the equipment apparatus heats the air flowing into the plenum to a temperature of substantially 95° F.

114. The air conditioning assembly according to claim 109, wherein a temperature differential between the air supplied to the air passageway and the air from the equipment assembly is substantially 40° F.

115. The method as claimed in claim 98, which comprises positioning the equipment assembly in a cabinet and positioning the flow control member in said cabinet upstream of said equipment so as to control air flow to said equipment.

116. The cooling apparatus as claimed in claim 98, which comprises a cabinet within which the equipment assembly is located and wherein a flow control member is positioned so as to be spaced from a wall of the cabinet so as to form a space within which the cooling air is communicated prior to being received by the equipment assembly.

117. An air conditioning assembly as claimed in claim 98, wherein the equipment assembly comprises at least one computer processing unit.

118. An air conditioning assembly as claimed in claim 109, which comprises a flow control member positioned upstream of said equipment assembly so as to substantially evenly distribute the cooling air to the equipment assembly.

119. An air conditioning assembly, which comprises:
   cooling means in communication with an air passageway of a room for introducing cooling air into the passageway;
   an equipment assembly positioned on a floor of the room, the equipment having an opening in communication with an opening formed in the floor for receiving the cooling air from the cooling apparatus;
   duct means separated from the room and in communication with the air passageway for receiving air flowing from the equipment assembly which has been heated by the equipment assembly and for communicating the air heated by the equipment assembly into the cooling means.

120. An conditioning assembly as claimed in claim 119, which comprises at least one opening in the equipment assembly communicating air heated by the cooling equipment into a room in which the cooling apparatus is located.

121. The air conditioning assembly as claimed in claim 119, which comprises at least one fan for communicating the heated air with a duct.

122. An air conditioning assembly as claimed in claim 119, wherein the cooling apparatus cools the cooling air to a temperature of substantially 55° F.

123. The air conditioning assembly as claimed in claim 119, wherein the equipment apparatus heats the air blowing into the duct to a temperature of substantially 95° F.

124. The air conditioning assembly according to claim 98, wherein a temperature differential between the air supplied to the air passageway and the air from the equipment assembly is substantially 40° F.

125. The method as claimed in claim 98, which comprises positioning the equipment assembly in a cabinet and positioning a flow control member in said cabinet upstream of said equipment so as to control air flow to said equipment.

126. The cooling apparatus as claimed in claim 98, which comprises a cabinet means within which the equipment assembly is located and wherein a flow control means is positioned so as to be spaced from a wall of the cabinet so as to form a space within which the cooling air is communicated prior to being received by the equipment assembly.

127. An air conditioning assembly as claimed in claim 119, wherein the equipment assembly comprises at least one computer processing unit.

128. An air conditioning assembly as claimed in claim 119, which comprises flow control means positioned upstream of said equipment assembly so as to substantially evenly distribute the cooling air to the equipment assembly.

* * * * *